(12) United States Patent
Kimoto

(10) Patent No.: US 12,224,381 B2
(45) Date of Patent: Feb. 11, 2025

(54) ELEMENT AND ELECTRONIC DEVICE HAVING A MIXED LAYER OF QUANTUM DOTS AND NANOPARTICLES

(71) Applicant: SHARP KABUSHIKI KAISHA, Sakai (JP)

(72) Inventor: Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 401 days.

(21) Appl. No.: 17/639,531

(22) PCT Filed: Sep. 2, 2019

(86) PCT No.: PCT/JP2019/034455
§ 371 (c)(1),
(2) Date: Mar. 1, 2022

(87) PCT Pub. No.: WO2021/044493
PCT Pub. Date: Mar. 11, 2021

(65) Prior Publication Data
US 2022/0328730 A1 Oct. 13, 2022

(51) Int. Cl.
*H01L 33/50* (2010.01)
*H01L 33/38* (2010.01)

(52) U.S. Cl.
CPC ............ *H01L 33/502* (2013.01); *H01L 33/38* (2013.01)

(58) Field of Classification Search
CPC ....... H01L 33/14; H01L 33/38; H01L 33/502; H01L 31/035218; H10K 50/115; H05B 33/14
See application file for complete search history.

(56) References Cited

U.S. PATENT DOCUMENTS

| | | |
|---|---|---|
| 2012/0138894 A1 | 6/2012 | Qian et al. |
| 2015/0228850 A1* | 8/2015 | Zheng .................. H01L 33/305 257/13 |
| 2019/0273214 A1* | 9/2019 | Li ......................... H10K 71/00 |
| 2019/0288225 A1* | 9/2019 | Chen .................... H10K 71/00 |
| 2020/0067005 A1* | 2/2020 | Park ..................... H10K 85/115 |
| 2021/0167295 A1* | 6/2021 | Stubbs .................. C09K 11/70 |

FOREIGN PATENT DOCUMENTS

| | | |
|---|---|---|
| JP | 2012533156 A | 12/2012 |
| WO | 2012161179 A1 | 11/2012 |

\* cited by examiner

*Primary Examiner* — Marcos D. Pizarro
*Assistant Examiner* — Tiberiu Dan Onuta
(74) *Attorney, Agent, or Firm* — ScienBiziP, P.C.

(57) ABSTRACT

In an element provided with a QD layer including QD phosphor particles, a first hole transport layer located between a first electrode and the QD layer is formed of a continuous film of a first carrier transport material. A second hole transport layer located between the first hole transport layer and the QD layer includes nanoparticles formed of a second carrier transport material.

20 Claims, 5 Drawing Sheets

ELEMENT AND ELECTRONIC DEVICE HAVING A MIXED LAYER OF QUANTUM DOTS AND NANOPARTICLES

TECHNICAL FIELD

An aspect of the disclosure relates to an element containing quantum dot (QD) phosphor particles.

BACKGROUND ART

In recent years, elements containing QD phosphor particles (also referred to as semiconductor nanoparticle phosphors) (photoelectric conversion elements) have been used. PTL 1 discloses a light-emitting element that is an example of these elements. The light-emitting element of PTL 1 includes (i) a layer containing QD phosphor particles (a light-emitting layer), and (ii) a layer containing inorganic nanoparticles (an electron injection/transport layer or a hole injection/transport layer).

CITATION LIST

Patent Literature

PTL 1: JP 2012-533156 T

SUMMARY

Technical Problem

An aspect of the disclosure aims to improve performance of an element as compared with the related art.

Solution to Problem

To solve the above problem, an element according to an aspect of the disclosure
includes: a first electrode; a second electrode; a quantum dot phosphor layer located between the first electrode and the second electrode and including quantum dot phosphor particles; a first carrier transport layer located between the first electrode and the quantum dot phosphor layer and formed of a continuous film of a first carrier transport material; and a second carrier transport layer located between the first carrier transport layer and the quantum dot phosphor layer and including nanoparticles formed of a second carrier transport material.

Furthermore, to solve the problem described above, an element according to an aspect of the disclosure includes: a first electrode; a second electrode; a quantum dot phosphor layer located between the first electrode and the second electrode and including quantum dot phosphor particles; a first carrier transport layer located between the first electrode and the quantum dot phosphor layer and formed of a continuous film of a first carrier transport material; and a mixed layer located between the first carrier transport layer and the quantum dot phosphor layer and including (i) the quantum dot phosphor particles and (ii) nanoparticles formed of a second carrier transport material.

Advantageous Effects of Disclosure

According to the aspect of the disclosure, it is possible to improve performance of an element as compared with the related.

DESCRIPTION OF EMBODIMENTS

First Embodiment

Figure 1:
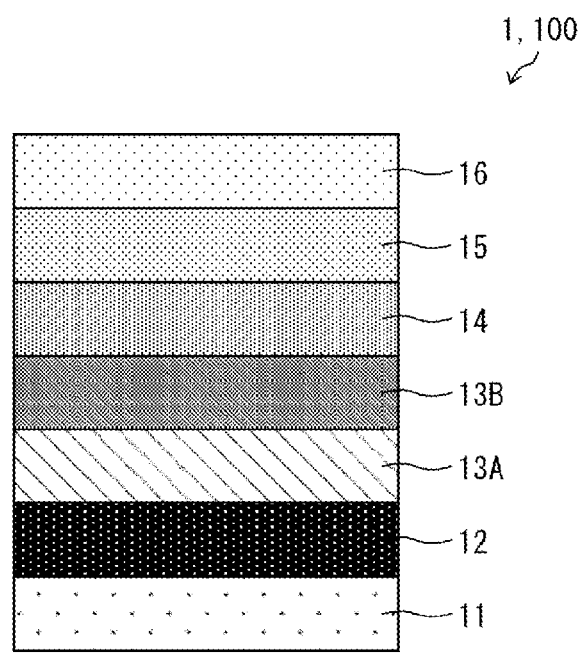
FIG. 1 is a diagram illustrating a schematic configuration of an element according to a first embodiment.

FIG. 1 illustrates a schematic configuration of an element 1 (photoelectric conversion element) according to a first embodiment. An electronic device with the element 1 will be referred to as an electronic device 100. In the first embodiment, a case in which the element 1 is a light-emitting element (more specifically, an electroluminescence element) will be primarily exemplified. The element 1 may be used as a light source for the electronic device 100 (for example, a display device).

Among members included in the element 1, members that are not relevant to the first embodiment will be omitted. It may be understood that the members for which descriptions are omitted are similar to those known in the art. Further, note that each drawing schematically describes a shape, a structure, and a positional relationship of each member, and is not necessarily drawn to scale.

Outline of Element 1

In the element 1, a QD layer 14 (quantum dot phosphor layer) is provided between a first electrode 12 and a second electrode 16. In the first embodiment, the first electrode 12 is an anode (anode electrode) and the second electrode 16 is a cathode (cathode electrode). In the present specification, the direction from a substrate 11, which will be described below, toward the first electrode 12 (or the second electrode 16) will be referred to as an upward direction. In addition, the direction opposite to the upward direction will be referred to as a downward direction.

Figure 3:
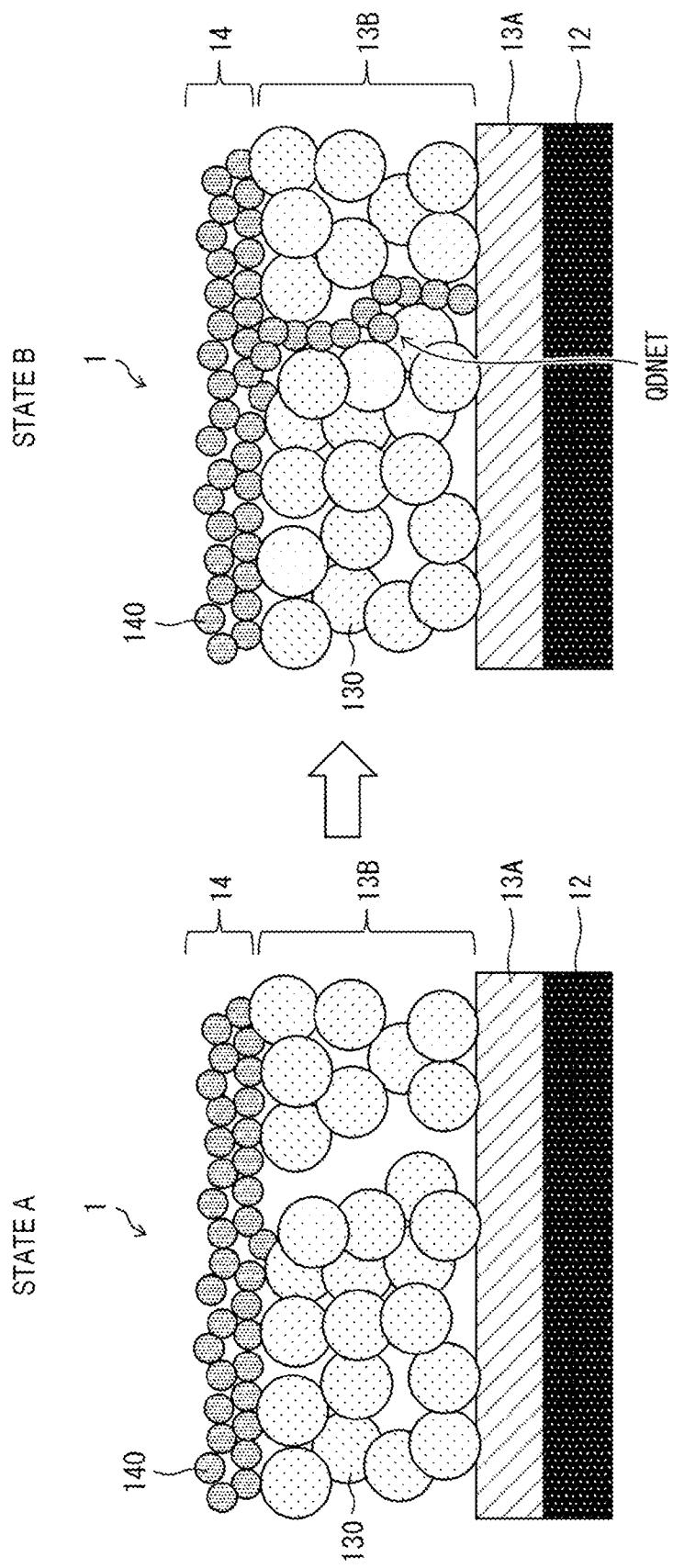
FIG. 3 is a diagram for explaining an effect of the element in FIG. 1.

As illustrated in FIG. 3 described below, the QD layer 14 contains QD phosphor particles 140 (quantum dot phosphor particles). The QD phosphor particles 140 emit light in association with recombination of holes supplied from the first electrode 12 and electrons supplied from the second electrode 16. The QD layer 14 of the first embodiment functions as a light-emitting layer.

The element 1 includes, upward from the substrate 11, the first electrode 12, a first hole transport layer (HTL) 13A, a second hole transport layer 13B, the QD layer 14, an electron transport layer (ETL) 15, and the second electrode 16 in this order. The first electrode 12 and the second electrode 16 can each be connected to a power supply (not illustrated) provided in the electronic device 100.

The first hole transport layer 13A and the second hole transport layer 13B in the first embodiment are examples of a first carrier transport layer and a second carrier transport layer according to an aspect of the disclosure, respectively. First, portions except the first hole transport layer 13A and the second hole transport layer 13B will be described.

The substrate 11 supports the first electrode 12 to the second electrode 16. The substrate 11 may be formed of a light-transmissive material or may be formed of a light-reflective material.

The first electrode 12 and the second electrode 16 are each formed of a conductive material. The first electrode 12 also functions as a hole injection layer (HIL). The first electrode 12 injects holes to the first hole transport layer 13A. The second electrode 16 also functions as an electron injection layer (EIL). The second electrode 16 injects electrons to the electron transport layer 15.

Note that a hole injection layer may be further provided between the first electrode 12 and the first hole transport layer 13A. Similarly, an electron injection layer may be further provided between the second electrode 16 and the electron transport layer 15.

At least one of the first electrode 12 and the second electrode 16 may be a light-transmissive electrode that transmits light (e.g., light emitted from the QD layer 14). Examples of a material of the light-transmissive electrode include ITO, ZnO, $SnO_2$, and FTO.

Alternatively, one of the first electrode 12 and the second electrode 16 may be a reflective electrode that reflects light. Examples of a material of the reflective electrode include Al, Ag, Cu, and Au.

By applying a forward voltage between the first electrode 12 and the second electrode 16 (by causing the first electrode 12 to have a potential higher than that of the second electrode 16) using the power supply, (i) holes can be supplied from the first electrode 12 to the QD layer 14 and (ii) electrons can be supplied from the second electrode 16 to the QD layer 14.

As a result, in the QD layer 14 (more specifically, QD phosphor particles 140), light can be generated as a result of recombination of holes and electrons. In this way, the QD layer 14 emits light with electro-luminescence (EL) (more specifically, injection type EL). A band gap of the QD phosphor particles 140 is preferably set in such a manner that the QD phosphor particles 140 emit visible light in a predetermined wavelength range with EL.

The voltage application by the power supply is controlled by, for example, a control circuit (not illustrated) provided in the electronic device 100. In other words, a light-emitting state of the element 1 is controlled by the control circuit. As an example, the control circuit includes a thin film transistor (TFT) as a switching element.

In an example in FIG. 3, the QD phosphor particles 140 each having a spherical shape are exemplified. However, the shape of each of the QD phosphor particles 140 is not limited to a spherical shape. For example, the shape of each of the QD phosphor particles 140 may be a rod shape, a wire shape, a disk shape, a triangular pyramid shape, a quadrangular pyramid shape, or the like. Any known shape may be adopted as the shape of each of the QD phosphor particles 140. This also applies to nanoparticles 130 described below.

Note that a particle size of each of the QD phosphor particles 140 means a diameter of a circle having the same area as that of each of the QD phosphor particles 140 in a transmission-type microscope image. As an example, when the QD phosphor particles 140 each are spherical, the particle size of each of the QD phosphor particles 140 means the diameter of each of the QD phosphor particles 140. The same applies to a particle size of each of the nanoparticles 130.

The electron transport layer 15 includes an electron transport material (a material having an excellent electron transport property). The electron transport material may be contained in the electron transport layer 15 as nanoparticles (not illustrated). Examples of the electron transport material include ZnO (zinc oxide), $TiO_2$ (titanium oxide), $SrTiO_3$ (strontium titanate), and $SnO_2$ (tin oxide) (see also a fourth embodiment described below). The electron transport layer 15 may be configured as a layer similar to a second electron transport layer 45B of the fourth embodiment.

First Hole Transport Layer 13A and Second Hole Transport Layer 13B

Each of the first hole transport layer 13A and the second hole transport layer 13B includes a hole transport material (a material having an excellent hole transport property) The first hole transport layer 13A and the second hole transport layer 13B are located between the first electrode 12 and the QD layer 14. Furthermore, as illustrated in FIG. 1, the second hole transport layer 13B is located between the first hole transport layer 13A and the QD layer 14. In other words, the first hole transport layer 13A is disposed closer to the first electrode 12 than the second hole transport layer 13B.

In the present specification, the hole transport material and the electron transport material are collectively referred to as carrier transport materials. Likewise, the hole transport layer and the electron transport layer are collectively referred to as carrier transport layers. Hereinafter, a carrier transport material of a first carrier transport layer is referred to as a first carrier transport material. A carrier transport material of a second carrier transport layer is referred to as a second carrier transport material. Furthermore, a hole transport material of the first hole transport layer 13A is referred to as a first hole transport material. A hole transport material of the second hole transport layer 13B is referred to as a second hole transport material.

The first carrier transport layer the first hole transport layer 13A) is formed of a continuous film, unlike the second carrier transport layer (e.g., the second hole transport layer 13B). Specifically, the first carrier transport layer is formed of a continuous film of the first carrier transport material. Note that the first carrier transport material is preferably an inorganic compound (in particular, an oxide). More specifically, the first carrier transport material is preferably a compound semiconductor (in particular, an oxide semiconductor).

As described above, the first carrier transport material is preferably an oxide. Thus, in a case where the first electrode is an anode (a case of the first embodiment), an element most contained as an anion in the first hole transport material is preferably oxygen. In addition, in the first hole transport material, an element most contained as a cation is preferably Ni or Cu. Thus, the first hole transport material may be an oxide of Ni or Cu. For example, as the first hole transport material, NiO (nickel oxide), $Cu_2O$ (copper oxide), or $Mg_xNi_yO_z$ (magnesium nickel oxide) is suitably used. These materials are compound semiconductors (more specifically, oxide semiconductors).

The continuous film is a "film" with substantially no void. This means that the continuous film (the first carrier transport layer) may be expressed as a dense carrier transport layer. As an example, in the present specification, the "dense carrier transport layer" refers to a "carrier transport layer having a porosity of 1% or less". Thus, the porosity of the first carrier transport layer is 1% or less. Preferably, the porosity of the first carrier transport layer is 0.1% or less.

Hereinafter, a direction of a plane perpendicular to a film thickness direction of the continuous film (e.g., an upward direction) will be referred to as a film surface direction. As an example, the continuous film may include an amorphous phase. In this case, the continuous film may be an amorphous film formed of an amorphous phase extending throughout a predetermined range in the film surface direction. Alternatively, the continuous film may include a crystalline phase (a monocrystalline or polycrystalline phase). In this case, the continuous film may be a film in which the crystalline phase and the amorphous phase are continuously bonded throughout the predetermined range in the film surface direction.

As an example, a virtual solid body (a rectangular parallelepiped) defined by (i) a virtual predetermined square located in the film surface direction and (ii) a thickness of the continuous film (film thickness) is considered. The predetermined range is assumed to be an entirety of the virtual solid body. Hereinafter, the thickness of the continuous film is denoted as d, and a length of one side of the square is denoted as l. Atoms contained in the continuous film (more specifically, atoms constituting the first carrier transport material) are continuously bonded by a strong chemical bond (e.g., covalent bonding or ionic bonding) in the continuous film.

Particularly preferably, the atoms are continuously bonded throughout the continuous film. However, the atoms only need be continuously bonded throughout the entirety of the predetermined range. As an example, l only need be two or more times as large as d. l is preferably 10 or more times as large as d. l is more preferably 100 or more times as large as d.

Furthermore, the continuous film preferably has no void throughout the predetermined range. The continuous film more preferably has no void throughout the continuous film.

The atoms are firmly bonded in the continuous film, and thus the first carrier transport material is unlikely to be removed by an organic solvent (or ultrasonic washing). In particular, in a case where the first carrier transport material is an inorganic material, the first carrier transport material is less susceptible to the organic solvent.

As an example, the first carrier transport layer may be manufactured by a sputtering method, a chemical vapor deposition (CVD) method, or an atomic layer deposition (ALD) method. Alternatively, the first carrier transport layer may be manufactured by a sol-gel method (an example of a coating method).

Subsequently, the second carrier transport layer (e.g., the second hole transport layer 13B) will be described. The second carrier transport layer includes nanoparticles formed of the second carrier transport material (e.g., nanoparticles formed of the second carrier transport material). For example, as illustrated in FIG. 3, the second hole transport layer 13B includes the nanoparticles 130 formed of the second hole transport material. The second carrier transport material may be a compound semiconductor.

The second carrier transport layer is a "layer" formed by applying and drying a dispersion including nanoparticles formed of the second carrier transport material (nanoparticle dispersion). As an example, the second carrier transport layer may b e manufactured by a known coating method (e.g., a spin coating method, a printing method, or an inkjet method).

As described above, the second carrier transport layer is a layer derived from the nanoparticle dispersion. Thus, the second carrier transport layer has a high porosity as compared with that of the first carrier transport layer. For example, a case in which nanoparticles contained in the second carrier transport layer are spheres each having an identical diameter is considered. In this case, a closest packing rate of the nanoparticles in the second carrier transport layer was calculated to be approximately 74%. In other words, the porosity of the second carrier transport layer is 26% or greater.

Note that, depending on shapes and particle size distribution of the nanoparticles contained in the second carrier transport layer, the porosity of the second carrier transport layer may be different from the example described above. However, of course, the porosity of the second carrier transport layer is sufficiently larger than 1%.

As described above, the nanoparticles in the second carrier transport layer are derived from the nanoparticle dispersion. Thus, the nanoparticles in the second carrier transport layer have not been sintered with each other. As a result, unlike the first carrier transport material in the first carrier transport layer, in many cases, the nanoparticles are bonded to each other by weak chemical bonding (e.g., van der Waals bonding) in the second carrier transport layer.

In other words, the nanoparticles only gather in the film thickness direction and the film surface direction of the second carrier transport layer under the weak chemical bonding. Thus, the nanoparticles are likely to be removed by, for example, ultrasonic washing. Furthermore, the nanoparticles each often have a ligand including an organic material. In this case, the nanoparticles are particularly susceptible to an organic solvent.

Relationship between First Carrier Transport Material and Second Carrier Transport Material The first carrier transport material and the second carrier transport material are preferably an identical material. According to the configuration, an electrical contact property between the first carrier transport layer and the second carrier transport layer (hereinafter, an electrical contact property) is good.

Furthermore, the first carrier transport material and the second carrier transport material preferably include an identical cation. According to the configuration, the electrical contact property between the first carrier transport layer and the second carrier transport layer is also improved.

Furthermore, the element most contained as a cation in the first carrier transport material and the element most contained as a cation in the second carrier transport material are more preferably an identical element. According to the configuration, the electrical contact property between the first carrier transport layer and the second carrier transport layer are further improved.

As described above, in the first embodiment, as the material of the nanoparticles 130 (second hole transport material), the same material as the first hole transport material is preferably selected. As described above, the same material is preferably a compound semiconductor (in particular, an oxide semiconductor).

Note that in order to further improve the electrical contact property between the first carrier transport layer and the second carrier transport layer, a conductivity type of the first carrier transport layer is preferably the same as a conductivity type of the second carrier transport layer. For example, in the first embodiment, the conductivity types of the first hole transport layer 13A and the second hole transport layer 13B each are a p-type. Furthermore, in the fourth embodiment described below, conductivity types of a first electron transport layer 45A and a second electron transport layer 45B each are an n-type.

However, at least one of the conductivity type of the first carrier transport layer and the conductivity type of the second carrier transport layer may be an i-type (intrinsic type). For example, one of the conductivity type of the first carrier transport layer and the conductivity type of the second carrier transport layer may be the i-type. This is because in this case, it is also possible to achieve a certain degree of the electrical contact property between the first carrier transport layer and the second carrier transport layer.

Comparative Example

Figure 2:
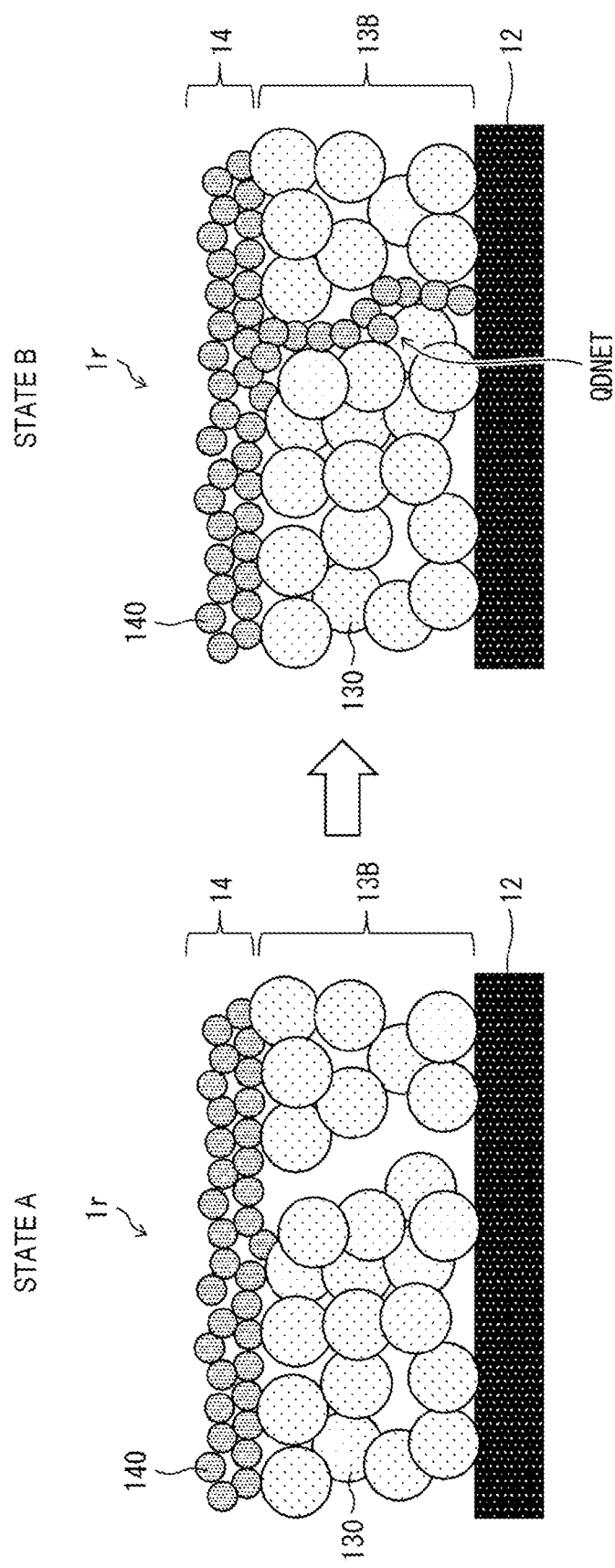
FIG. 2 is a diagram for explaining a problem of an element of a comparative example.

Prior to describing an effect of the element 1, an element 1r as a comparative example will be described. FIG. 2 is a diagram for explaining a problem in the element 1r. FIG. 2 is a diagram paired up with FIG. 3 described below. Unlike the element 1, the element it does not include the first hole transport layer 13A. However, in other respects, the element 1r is assumed to be similar to the element 1.

In FIG. 2, a case in which a particle size (hereinafter, Dqd) of each of the QD phosphor particles 140 is smaller than a particle size (hereinafter, Dnano) of each of the nanoparticles 130 is exemplified. However, it should be noted that in the element according to an aspect of the disclosure, Dqd<Dnano is not a limitation. The element may satisfy a relationship of Dqd>Dnano. Alternatively, the element may satisfy a relationship of Dqd=Dnano.

In FIG. 2, a state A indicates an initial state (a state before a QDNET described below is formed). As described above, the porosity of the second hole transport layer 13B is relatively large. Thus, a size of each of voids formed in the second hole transport layer 13B may be relatively large. For example, a void having a size larger than Dqd may be formed in the second hole transport layer 13B.

Note that voids in the state A of FIG. 2 are illustrated in an exaggerated manner for convenience of explanation. This similarly applies to a state A in FIG. 3.

A part of the QD phosphor particles 140 located on the upper surface of the second hole transport layer 13B enters the voids in the second hole transport layer 13B over time during or after film formation of the QD layer 14. Subsequently, the QD phosphor particles 140 pass through the voids and proceed to the first electrode 12 (anode, hole injection layer) located below.

Then, eventually, as illustrated in a state B in FIG. 2, a network of the QD phosphor particles 140 passing through the second hole transport layer 13B (hereinafter, QDNET) is formed. The QDNET is also referred to as a QD network. The state B can also be expressed as a state after the QDNET is formed (state after the QD network formation).

In the state B, the QDNET is in contact with the first electrode 12. Thus, in the element 1r, a leakage current is generated due to the contact between the QD phosphor particles 140 in the QDNET and the first electrode 12 (i.e., short circuit between the QD phosphor particles 140 and the first electrode 12). The leakage current leads to reduction in efficiency of the element 1r (e.g., light emission efficiency).

Note that with a smaller Dqd, the QD phosphor particles 140 are more likely to enter the voids in the second hole transport layer 13B. Thus, the smaller the Dqd, the greater the leakage current, so that the efficiency of the element 1r is significantly reduced.

In addition, the inventors of the present application have newly found that "formation of the QDNET may also progress over time while the element is operating, which significantly impairs the reliability of the element".

Effect of Element 1

FIG. 3 is a diagram for explaining an effect of the element 1. In the element 1, unlike the element 1r, the first hole transport layer 13A is provided. As described above, the first hole transport layer 13A is formed of a continuous film (a continuous film having substantially no void) of the first hole transport material. Thus, the porosity of the first hole transport layer 13A is extremely small as compared with the porosity of the second hole transport layer 13B.

As illustrated in a state B in FIG. 3, in the element 1, like the element 1r, a QDNET passing through the second hole transport layer 13B is also formed over time. However, it is possible to prevent the QDNET from reaching the first electrode 12 by providing the first hole transport layer 13A. This is because the first hole transport layer 13A is a continuous film, and thus it is difficult that the QD phosphor particles 140 pass through the first hole transport layer 13A and proceed downward.

In this way, the first hole transport layer HA interposed between the second hole transport layer 13B and the first electrode 12 functions as a blocking layer (shielding layer) that prevents the QDNET from proceeding downward. Thus, in the element 1, the QD phosphor particles 140 in the QDNET and the first electrode 12 are less likely to come into contact with each other as compared with in the element 1r.

As a result, according to the element 1, the leakage current can be reduced as compared with the element 1r. That is, according to the element 1, a higher element efficiency can be achieved as compared with the element 1r. As described above, it is possible to improve the performance of the element more than in the related prior by providing the first carrier transport layer (e.g., the first hole transport layer 13A).

Modified Example

The QD layer 14 may be used as a light absorption layer that absorbs light of a predetermined wavelength band and generates an electrical signal (e.g., voltage or current). That is, the element 1 may be used as a light receiving element. In this case, the QD layer 14 functions as a light absorption layer having an excellent energy conversion efficiency (power generation efficiency). The electronic device 100 may be, for example, a solar cell. Alternatively, the element 1, which is a light receiving element, can also be used as an imaging element (image sensor). In this case, the electronic device 100 may be an imaging taking apparatus (e.g., a digital camera).

In a case where the element 1 is used as a light receiving element, a band gap of the QD phosphor particles 140 may be set such that EL does not emit visible light. For example, a band gap of the QD phosphor particles 140 may be set such that EL or photo-luminescence (PL) emits invisible light (e.g., ultraviolet or infrared light).

Second Embodiment

Figure 4:
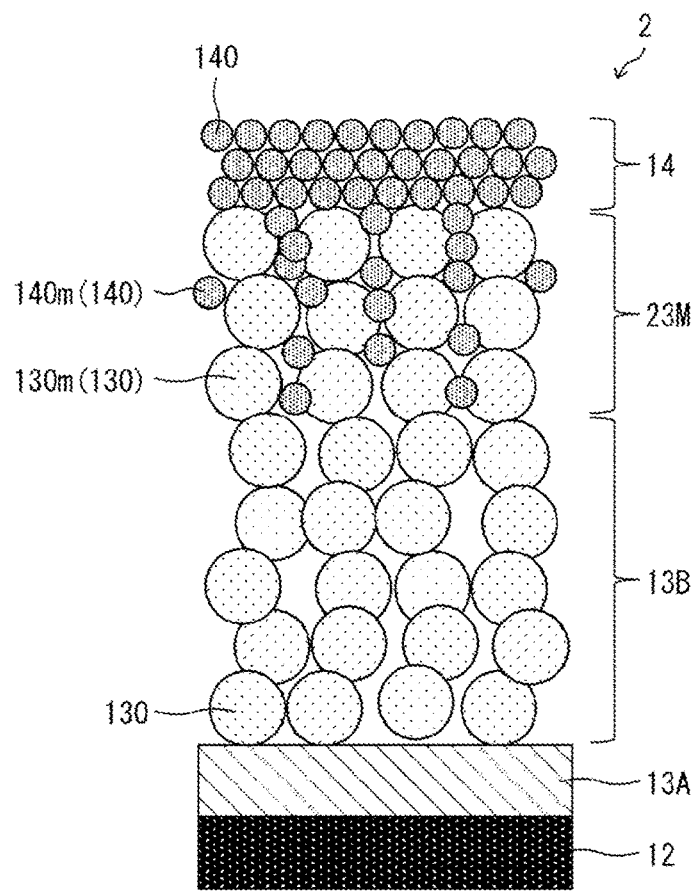
FIG. 4 is a diagram illustrating a configuration of a main part of an element according to a second embodiment.

FIG. 4 illustrates a configuration of a main part of an element 2 according to a second embodiment. FIG. 4 is a diagram corresponding to FIG. 3. In FIG. 4, only a diagram corresponding to the state A in FIG. 3 is illustrated for simplicity. This similarly applies to FIG. 5 described below.

The element 2 further includes a mixed layer 23M, unlike the element 1. The mixed layer 23M is located between the QD layer 14 and the second hole transport layer 13B. As illustrated in FIG. 4, the mixed layer 23M contains the QD phosphor particles 140 and the nanoparticles 130.

Hereinafter, for convenience of description, the QD phosphor particles 140 contained in the mixed layer 23M are also referred to as QD phosphor particles 140m. The QD phosphor particles 140m may be referred to as intra-mixed layer QD phosphor particles. In addition, the nanoparticles 130 contained in the mixed layer 23M are also referred to as nanoparticles 130*m*. The nanoparticles 130*m* may be referred to as intra-mixed layer nanoparticles.

As described above, in the mixed layer 23M, both the QD phosphor particles 140*m* and the nanoparticles 130*m* are present. Thus, in the mixed layer 23M, a void having a size larger than the Dqd is less likely to be formed as compared with the second hole transport layer 13B. In other words, in the mixed layer 23M, the size of each of the voids decreases as compared with the second hole transport layer 13B.

Thus, the QDNET is less likely to be generated in the mixed layer 23M as compared with in the second hole transport layer 13B. As a result, a leakage current caused by generation of the QDNET can be more reliably reduced. For example, even if a structural defect (e.g., a pinhole) is generated in the first hole transport layer 13A, the leakage current can be prevented by the mixed layer 23M. Thus, according to the element 2, a higher efficiency can be achieved as compared with the element 1.

In addition, in the element 2, a QD phosphor particle structural body in which (i) the QD phosphor particles 140 in the QD layer 14 and (ii) the QD phosphor particles 140*m* in the mixed layer 23M are in contact with each other and connected is formed. Furthermore, in the element 2, a hole transport material structural body in which (i) the first hole transport layer 13A, (ii) the nanoparticles 130*m* in the second hole transport layer 13B, and (iii) the nanoparticles 130*m* in the mixed layer 23M are in contact with each other and connected is formed.

In the element 2, a contact area between the QD phosphor particle structural body and the hole transport material structural body is greater than a contact area between the QD layer 14 and the second hole transport layer 13B in the element 1. Thus, carrier (hole) injection from the first hole transport layer 13A to the QD layer 14 is more promoted in the element 2 than in the element 1. In this way, according to the element 2, a higher efficiency can be achieved as compared with the element 1.

Note that in a transmission-type microscope image of a cross-section parallel to the film thickness direction of the element 2, a ratio (rate) of an area of the QD phosphor particles 140*m* to an area of the nanoparticles 130*m* in the mixed layer 23M is preferably (area of QD phosphor particles 140*m*):(area of nanoparticles 130*m*)=1:3 to 3:1. In this case, the leakage current caused by the generation of the QDNET can be more reliably suppressed, and a high element performance can be obtained.

As described above, according to the mixed layer 23M of the element 2, it is possible to further reduce the leakage current and promote carrier injection. In this way, according to the element 2, an even higher efficiency can be achieved as compared with the element 1.

Example of Method for Manufacturing Mixed Layer 23M

First, as a material of the mixed layer 23M, a liquid composition in which the QD phosphor particles 140 and the nanoparticles 130 are dispersed in a solvent is prepared. Then, a known film formation method is used to form the second hole transport layer 13B on the upper surface of the first hole transport layer 13A.

Subsequently, the liquid composition is applied to the upper surface of the formed second hole transport layer 13B to form a coating film of the liquid composition. Then, the solvent of the liquid composition is volatilized to form the mixed layer 23M.

Subsequently, a known film formation method is used to form the QD layer 14 on an upper surface of the mixed layer 23M. Then, remaining layers of the element 2 are formed. In this way, the element 2 including the mixed layer 23M located between the second hole transport layer 13B and the QD layer 14 can be obtained.

Third Embodiment

Figure 5:
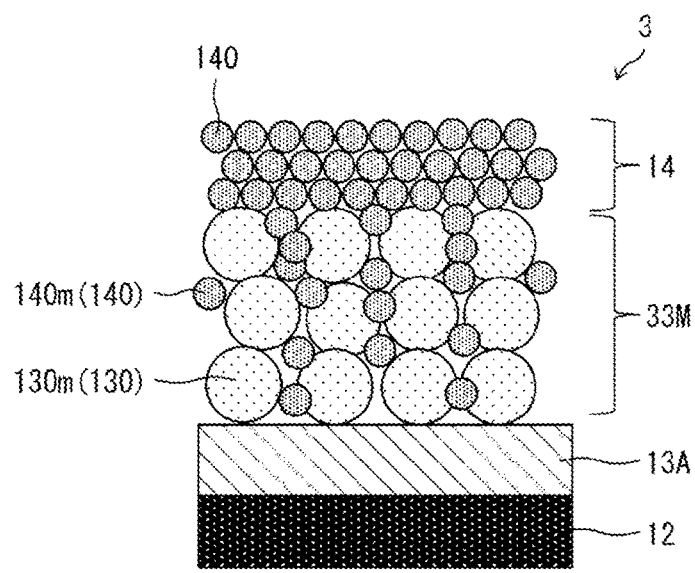
FIG. 5 is a diagram illustrating a main part of an element according to a third embodiment.

FIG. 5 illustrates a configuration of a main part of an element 3 according to a third embodiment. In the element 3, the second hole transport layer 13B of the element 1 is replaced with a mixed layer 33M. Thus, the mixed layer 33M is located between the first hole transport layer 13A and the QD layer 14.

Similarly to the mixed layer 23M, the mixed layer 33M includes the QD phosphor particles 140*m* and the nanoparticles 130*m*. Thus, in the mixed layer 33M, the QDNET is less likely to be generated as compared with the second hole transport layer 13B of the element 1. As a result, according to the mixed layer 33M, similarly to the mixed layer 23M, it is also possible to more reliably reduce the leakage current caused by the generation of the QDNET.

Furthermore, in the element 3, a QD phosphor particle structural body in which (i) the QD phosphor particles 140 in the QD layer 14 and (ii) the QD phosphor particles 140*m* in the mixed layer 33M are in contact with each other and connected is formed. In addition, in the element 3, a hole transport material structural body in which (i) the first hole transport layer 13A and (ii) the nanoparticles 130*m* in the mixed layer 33M are in contact with each other and connected is formed.

In the element 3, a contact area between the QD phosphor particle structural body and the hole transport material structural body is greater than a contact area between the QD layer 14 and the second hole transport layer 13B in the element 1. Thus, in the element 3, carrier (hole) injection from the first hole transport layer 13A to the QD layer 14 is more promoted than in the element 1. In this way, according to the element 3, it is also possible to achieve a higher efficiency as compared with the element 1.

Note that in the element 3, the mixed layer 33M is in contact with the first hole transport layer 13A. Thus, among the QD phosphor particles 140*m* in the mixed layer 33M, QD phosphor particles that do not constitute the QD phosphor particle structural body (an isolated QD phosphor particle or QD phosphor particle group that is not connected to the QD phosphor particle structural body) may be in contact with the first hole transport layer 13A. In this way, a part of the QD phosphor particles 140*m* contained in the mixed layer 33M may be in contact with the first hole transport layer 13A.

In a transmission-type microscope image of a cross-section parallel to the film thickness direction of the element 3, a rate of an area of the QD phosphor particles 140*m* to an area of the nanoparticles 130*m* in the mixed layer 33M is preferably (area of QD phosphor particles 140*m*):(area of nanoparticles 130*m*)=1:3 to 3:1. In this case, the leakage current caused by the generation of the QDNET can be more reliably suppressed, and a high element performance can be obtained.

Note that in the mixed layer 33M, a center of a nanoparticle 130*m* closest to the QD layer 14 is referred to as a nanoparticle first center. In addition, in the mixed layer 33M, a center of a nanoparticle 130*m* in contact with the first transport layer 13A is referred to as a nanoparticle second center.

As an example, among the QD phosphor particles 140*m* in the mixed layer 33M, a QD phosphor particle 140*m* having a center located closer to the first hole transport layer 13A as compared with the nanoparticle first center (referred to as first QD phosphor particle, for convenience) is present. In addition, among the QD phosphor particles 140m in the mixed layer 33M, a QD phosphor particle 140m occupying at least a part of a space located closer to the first hole transport layer 13A as compared with the nanoparticle second center (referred to as second QD phosphor particle, for convenience) is further present.

Fourth Embodiment

Figure 6:
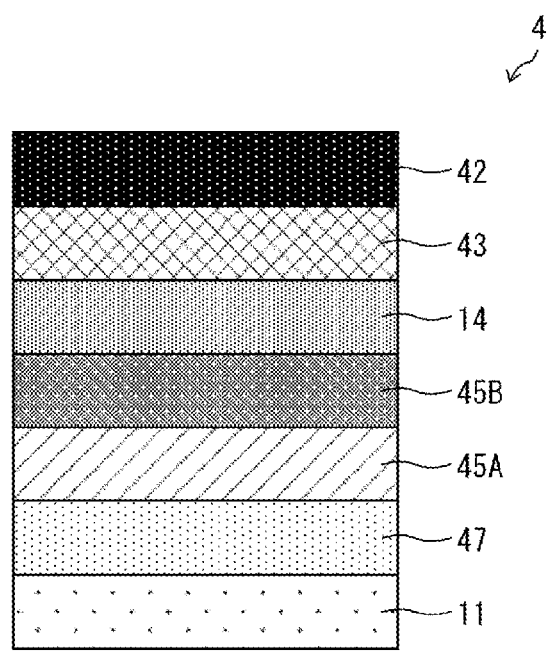
FIG. 6 is a diagram illustrating a schematic configuration of an element according to a fourth embodiment.

FIG. 6 illustrates a schematic configuration of an element 4 of a fourth embodiment. FIG. 6 is a diagram paired up with FIG. 1. The element 4 includes, upward from a substrate 11, a first electrode 47, a first electron transport layer 45A, a second electron transport layer 45B, a QD layer 14, a hole transport layer 43, and a second electrode 42 in this order.

In the fourth embodiment, the first electrode 47 is a cathode, and the second electrode 42 is an anode. The first electron transport layer 45A and the second electron transport layer 45B in the fourth embodiment are other examples of the first carrier transport layer and the second carrier transport layer, respectively, according to the aspect of the disclosure. Hereinafter, an electron transport material of the first electron transport layer 45A will be referred to as a first electron transport material. An electron transport material of the second electron transport layer 45B will be referred to as a second electron transport material.

The first electrode 47 also functions as an electron injection layer. The first electrode 47 injects electrons to the first electron transport layer 45A. The second electrode 42 also functions as a hole injection layer. The second electrode 42 injects holes to the hole transport layer 43. The hole transport layer 43 may be configured as a layer similar to the second hole transport layer 13B of the first embodiment.

The first electron transport layer 45A is a layer paired up with the first hole transport layer 13A of the first embodiment. The first electron transport layer 45A is formed of a continuous film of the first electron transport material. As described above, the first carrier transport material is preferably an oxide. Thus, in a case where the first electrode is a cathode (in a case of the fourth embodiment), an element most contained as an anion in the first electron transport material is preferably oxygen. In addition, in the first electron transport material, an element most contained as a cation is preferably any one of Zn, Ti, Sr, and Sn. Thus, the first electron transport material may be an oxide of any one of Zn, Ti, Sr, and Sn. For example, as the first electron transport material, $ZnO$, $TiO_2$, $SrTiO_3$, or $SnO_2$ is suitably used. These materials are compound semiconductors (more specifically, oxide semiconductors).

The second electron transport layer 45B is a layer paired up with the second hole transport layer 13B of the first embodiment. The second electron transport layer 45B includes nanoparticles (not illustrated) formed of the second electron transport material. Thus, the second electron transport layer 45B has a sufficiently high porosity as compared with that of the first electron transport layer 45A. As the second electron transport material, the same material as the first electron transport material is preferably selected.

In the element 4, an effect similar to that of the element 1 is also obtained by a mechanism similar to that of the first embodiment (see the state B in FIG. 3). In the element 4, the first electron transport layer 45A interposed between the second electron transport layer 45B and the first electrode 47 functions as a blocking layer that prevents the QDNET from proceeding downward. As described above, according to the element 4, it is also possible to realize an element having a more excellent performance than in the related.

Note that, in the fourth embodiment, an additional electron injection layer may be provided between the first electrode 47 and the first electron transport layer 45A. Similarly, an additional hole injection layer may be provided between the second electrode 42 and the hole transport layer 43.

Modified Example

Of course, the configuration of the element 4 may be applied to the elements 2, 3. That is, in the second and third embodiment, the first electrode can be provided as a cathode, and the second electrode can be provided as an anode. In this case, the first carrier transport layer and the second carrier transport layer in the second and third embodiments are provided as the first electron transport layer and the second electron transport layer, respectively. The configuration also provides an effect similar to those of the second and third embodiments.

Supplement

An element of a first aspect includes: a first electrode; a second electrode; a quantum dot phosphor layer located between the first electrode and the second electrode and including quantum dot phosphor particles; a first carrier transport layer located between the first electrode and the quantum dot phosphor layer and formed of a continuous film of a first carrier transport material; and a second carrier transport layer located between the first carrier transport layer and the quantum dot phosphor layer and including nanoparticles formed of a second carrier transport material.

An element of a second aspect further includes a mixed layer located between the quantum dot phosphor layer and the second carrier transport layer and including the quantum dot phosphor particles and the nanoparticles.

In an element of a third aspect, the first carrier transport material is a compound semiconductor.

In an element of a fourth aspect, the compound semiconductor in the first carrier transport material is an oxide semiconductor.

In an element of a fifth aspect, the second carrier transport material is a compound semiconductor.

In an element of a sixth aspect, the compound semiconductor in the second carrier transport material is an oxide semiconductor.

In an element of a seventh aspect, a conductivity type of the first carrier transport layer is identical to a conductivity type of the second carrier transport layer.

In an element of an eighth aspect, at least one of the conductivity type of the first carrier transport layer and the conductivity type of the second carrier transport layer is an i-type.

In an element of a ninth aspect, the first carrier transport material and the second carrier transport material include an identical cation.

In an element of a tenth aspect, an element most contained as a cation in the first carrier transport material and an element most contained as a cation in the second carrier transport material are an identical element.

In an element of an eleventh aspect, the first carrier transport material and the second carrier transport material are an identical material.

In an element of a twelfth aspect, the first electrode is a cathode, the first carrier transport material is an oxide, and the element most contained as a cation in the first carrier transport material is any one of Zn, Ti, Sr, and Sn.

In an element of a thirteenth aspect, the second carrier transport material is an oxide, and the element most contained as a cation in the second carrier transport material is any one of Zn, Ti, Sr, and Sn.

In an element of a fourteenth aspect, the identical element is any one of Zn, Ti, Sr, and Sn.

In an element of a fifteenth aspect, the first electrode is an anode, the first carrier transport material is an oxide, and the element most contained as a cation in the first carrier transport material is Ni or Cu.

In an element of a sixteenth aspect, the second carrier transport material is an oxide, and the element most contained as a cation in the second carrier transport material is Ni or Cu.

In an element of a seventeenth aspect, the identical element is Ni or Cu.

An electronic device of an eighteenth aspect includes the element according to an aspect of the disclosure.

An element of a nineteenth aspect includes: a first electrode; a second electrode; a quantum dot phosphor layer located between the first electrode and the second electrode and including quantum dot phosphor particles; a first carrier transport layer located between the first electrode and the quantum dot phosphor layer and formed of a continuous film of a first carrier transport material; and a mixed layer located between the first carrier transport layer and the quantum dot phosphor layer and including (i) the quantum dot phosphor particles and (ii) nanoparticles formed of a second carrier transport material.

In an element of a twentieth aspect, a part of the quantum dot phosphor particles included in the mixed layer is in contact with the first carrier transport layer.

In an element of a twenty-first aspect, in the mixed layer, when a center of one of the nanoparticles closest to the quantum dot phosphor layer is defined as a nanoparticle first center and a center of one of the nanoparticles in contact with the first carrier transport layer is defined as a nanoparticle second center, as the quantum dot phosphor particles included in the mixed layer, a first quantum dot phosphor particle having a center located closer to the first carrier transport layer as compared with the nanoparticle first center and a second quantum dot phosphor particle occupying at least a part of a space located closer to the first carrier transport layer as compared with the nanoparticle second center are present.

APPENDIX

An aspect of the disclosure is not limited to the embodiments described above, and various modifications may be made within the scope of the claims. Embodiments obtained by appropriately combining technical approaches disclosed in the different embodiments also fall within the technical scope of the aspect of the disclosure. Moreover, novel technical features can be formed by combining the technical approaches disclosed in each of the embodiments.

The invention claimed is:

1. An element comprising:
a first electrode;
a second electrode;
a quantum dot phosphor layer located between the first electrode and the second electrode and including quantum dot phosphor particles;
a first carrier transport layer located between the first electrode and the quantum dot phosphor layer and formed of a continuous film of a first carrier transport material; and
a mixed layer located between the first carrier transport layer and the quantum dot phosphor layer and including (i) the quantum dot phosphor particles, and (ii) nanoparticles formed of a second carrier transport material,
wherein a part of the quantum dot phosphor particles included in the mixed layer is in contact with the first carrier transport layer.

2. The element according to claim 1,
wherein the first carrier transport material is a compound semiconductor.

3. The element according to claim 1,
wherein the second carrier transport material is a compound semiconductor.

4. The element according to claim 1,
wherein a conductivity type of the first carrier transport layer is identical to a conductivity type of the second carrier transport layer.

5. The element according to claim 1,
wherein at least one of a conductivity type of the first carrier transport layer and a conductivity type of the second carrier transport layer is an i-type.

6. The element according to claim 1,
wherein the first carrier transport material and the second carrier transport material contain an identical cation.

7. The element according to claim 1,
wherein the first electrode is a cathode,
the first carrier transport material is an oxide, and
an element most contained as a cation in the first carrier transport material is any one of Zn, Ti, Sr, and Sn.

8. The element according to claim 1,
wherein the second carrier transport material is an oxide, and
an element most contained as a cation in the second carrier transport material is any one of Zn, Ti, Sr, and Sn.

9. The element according to claim 1,
wherein the first electrode is an anode,
the first carrier transport material is an oxide, and
an element most contained as a cation in the first carrier transport material is Ni or Cu.

10. An electronic device comprising the element according to claim 1.

11. An element comprising:
a first electrode;
a second electrode;
a quantum dot phosphor layer located between the first electrode and the second electrode and including quantum dot phosphor particles;
a first carrier transport layer located between the first electrode and the quantum dot phosphor layer and formed of a continuous film of a first carrier transport material; and
a mixed layer located between the first carrier transport layer and the quantum dot phosphor layer and including (i) the quantum dot phosphor particles, and (ii) nanoparticles formed of a second carrier transport material,
wherein, when in the mixed layer,
a center of one of the nanoparticles closest to the quantum dot phosphor layer is defined as a nanoparticle first center, and
a center of one of the nanoparticles in contact with the first carrier transport layer is defined as a nanoparticle second center, and wherein as the quantum dot phosphor particles included in the mixed layer,
a first quantum dot phosphor particle having a center located closer to the first carrier transport layer, as compared with the nanoparticle first center, is present, and
a second quantum dot phosphor particle occupying at least a part of a space located closer to the first carrier transport layer, as compared with the nanoparticle second center, is present.

12. The element according to claim 11, wherein the first carrier transport material is a compound semiconductor.

13. The element according to claim 11, wherein the second carrier transport material is a compound semiconductor.

14. The element according to claim 11, wherein a conductivity type of the first carrier transport layer is identical to a conductivity type of the second carrier transport layer.

15. The element according to claim 11, wherein at least one of a conductivity type of the first carrier transport layer and a conductivity type of the second carrier transport layer is an i-type.

16. The element according to claim 11, wherein the first carrier transport material and the second carrier transport material contain an identical cation.

17. The element according to claim 11, wherein the first electrode is a cathode, the first carrier transport material is an oxide, and an element most contained as a cation in the first carrier transport material is any one of Zn, Ti, Sr, and Sn.

18. The element according to claim 11, wherein the second carrier transport material is an oxide, and an element most contained as a cation in the second carrier transport material is any one of Zn, Ti, Sr, and Sn.

19. The element according to claim 11, wherein the first electrode is an anode, the first carrier transport material is an oxide, and an element most contained as a cation in the first carrier transport material is Ni or Cu.

20. An electronic device comprising the element according to claim 11.

* * * * *